US005553032A

United States Patent [19]
Taguchi

[11] Patent Number: 5,553,032
[45] Date of Patent: Sep. 3, 1996

[54] DYNAMIC RANDOM ACCESS MEMORY WHEREIN TIMING OF COMPLETION OF DATA READING IS ADVANCED

[75] Inventor: Masao Taguchi, Sagamihara, Japan

[73] Assignee: Fujitsu Limited, Kawasaki, Japan

[21] Appl. No.: 424,212

[22] Filed: Apr. 19, 1995

Related U.S. Application Data

[62] Division of Ser. No. 310,369, Sep. 22, 1994, which is a continuation of Ser. No. 178,602, Jan. 7, 1994, abandoned, which is a continuation of Ser. No. 777,315, Dec. 2, 1991, abandoned.

[30] Foreign Application Priority Data

Mar. 30, 1990 [JP] Japan ........................... 2-83758

[51] Int. Cl.⁶ ........................................ G11C 7/00
[52] U.S. Cl. ............... 365/230.03; 365/149; 365/189.01; 365/207
[58] Field of Search ............................. 365/189.01, 149, 365/205, 207, 230.03

[56] References Cited

U.S. PATENT DOCUMENTS

| | | | |
|---|---|---|---|
| 4,947,377 | 8/1990 | Hannai | 365/208 |
| 4,954,992 | 9/1990 | Kimanoya et al. | 365/189.01 |
| 4,984,206 | 1/1991 | Komatsu et al. | 365/149 X |
| 5,051,954 | 9/1991 | Toda et al. | 365/189.02 |
| 5,184,326 | 2/1993 | Hoffmann et al. | 365/149 X |

FOREIGN PATENT DOCUMENTS

| | | |
|---|---|---|
| 0062547 | 10/1982 | European Pat. Off. |
| 0359203 | 3/1990 | European Pat. Off. |
| 63-209094 | 8/1988 | Japan |
| 1-235094 | 9/1989 | Japan |
| 2-146180 | 6/1990 | Japan |

OTHER PUBLICATIONS

Arimoto et al., "A Speed–Enhanced DRAM Array Architecture with Embedded ECC," IEEE Journal Of Solid–State Circuits, vol. 25, No. 1, Feb. 1990, New York, NY, pp. 11–16.

Primary Examiner—David C. Nelms
Assistant Examiner—Son Dinh
Attorney, Agent, or Firm—Staas & Halsey

[57] ABSTRACT

A dynamic random access memory includes a capacitor in at least one memory cell each for storing one bit digital data as a terminal voltage, at least one bit line corresponding to at least one memory cell, a gate provided for each of the capacitors in the memory cells and which controls an electrical connection/disconnection between a terminal of the capacitor in the memory cell which stores the terminal voltage and the bit line corresponding to the memory cell, and at least one data bus line provided for at least one bit line. A current is continuously supplied to each of at least one of the data bus lines from a predetermined source through a predetermined resistor, and a reading voltage output unit provided for each of the bit lines, connects a current input terminal thereof with a data bus corresponding to the bit line, and changes a voltage of the data bus according to the voltage change on the bit line.

3 Claims, 12 Drawing Sheets

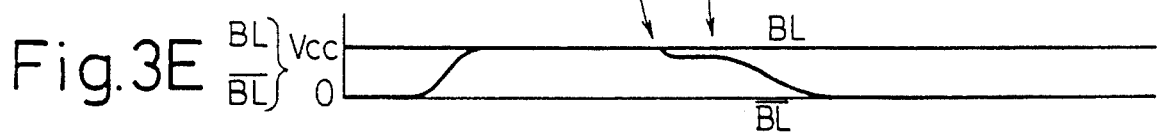
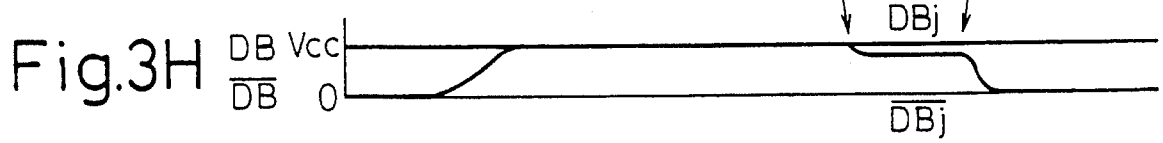

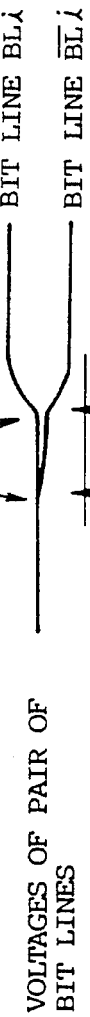

Fig.10A $\overline{RAS}$ $\overline{RAS}$ ROW ADDRESS LATCH

Fig.10B SIGNAL ON ADDRESS BUS

Fig.10C OUTPUT OF ADDRESS TRANSITION DETECTION CIRCUIT 9 — GENERATION OF ADT PULSE

Fig.10D OUTPUT OF CLOCK GENERATION CIRCUIT CG4 — COLUMN ADDRESS LATCH PULSE

Fig.10E OUTPUT OF AND GATE 7 — COLUMN GATE DRIVING PULSE

Fig.10F OUTPUT OF CLOCK GENERATION CIRCUIT CG3 — SENSE AMPLIFIER DRIVING PULSE

Fig.10G OUTPUT OF CLOCK GENERATION CIRCUIT CG2 — WORD LINE DRIVING PULSE

Fig.10H VOLTAGE OF WORD LINE — WORD LINE $WL_1, WL_2$

Fig.10I VOLTAGES OF PAIR OF BIT LINES — BIT LINE $BL_j$, BIT LINE $\overline{BL}_j$

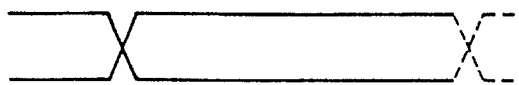
Fig.11A ADDRESS ON ADDRESS BUS
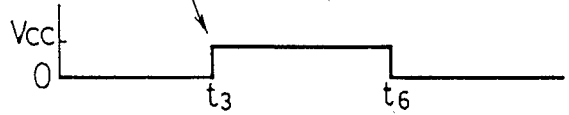
Fig.11B OUTPUT OF CLOCK GENERATION CIRCUIT CG5
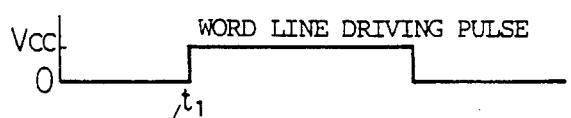
Fig.11C OUTPUT OF CLOCK GENERATION CIRCUIT CG2
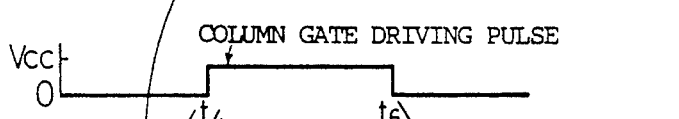
Fig.11D OUTPUT OF AND GATE 7
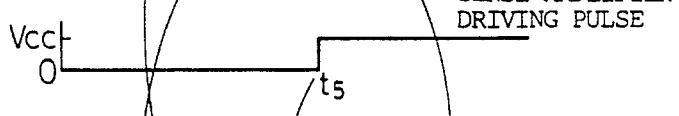
Fig.11E OUTPUT OF CLOCK GENERATION CIRCUIT CG3
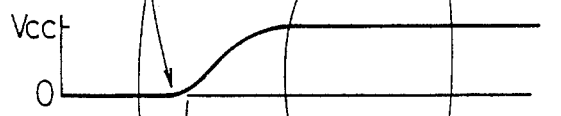
Fig.11F VOLTAGE OF WORD LINE
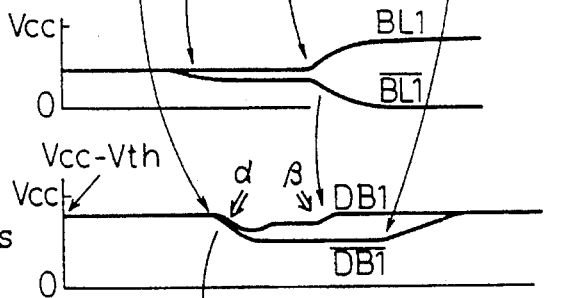
Fig.11G VOLTAGE OF PAIR OF BIT LINES
Fig.11H VOLTAGE OF PAIR OF DATA BUS LINES
Fig.11I OUTPUT VOLTAGE OF DATA BUS AMPLIFIER 21
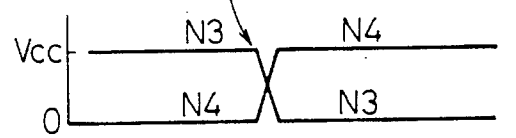
Fig.11J OUTPUT VOLTAGE OF DATA LATCH CIRCUIT

DYNAMIC RANDOM ACCESS MEMORY WHEREIN TIMING OF COMPLETION OF DATA READING IS ADVANCED

This application is a division of application Ser. No. 08/310,369, filed Sep. 22, 1994, which is a continuation of application Ser. No. 08/178,602, filed Jan. 7, 1994, now abandoned, which is a continuation of application Ser. No. 07/777,315, filed Dec. 2, 1991, now abandoned.

FIELD OF THE PRESENT INVENTION

The present invention relates to a semiconductor memory device, and in particular, to a dynamic random access memory (DRAM). The present invention further relates to a control signal generation circuit for the dynamic random access memory.

Some semiconductor memory devices having a large capacity have a divided cell array structure wherein each bit line (array) is divided, and a sense amplifier is provided for each of the divided bit arrays. Further, the present invention relates to control of a signal transmission between bit lines and data bus lines, and timing of control signals for the control of the data reading and writing operations.

DESCRIPTION OF THE RELATED ART

FIG. 1 is a diagram indicating an example of the dynamic random access memory having the divided cell array structure. In this example, a memory cell array is divided into four memory cell arrays (rows) MCAm (m=1 to 4). A pair of bit lines BLi, $\overline{BLi}$ (i=1,2, ...) are connected to each row MCAm of the memory cell array. A sense amplifier SA is connected to each pair of bit lines BLi, $\overline{BLi}$, and the bit lines BLi, $\overline{BLi}$ in each pair are respectively connected to data bus lines DBj, $\overline{DBj}$ forming a pair, where the pair of data bus lines DBj, $\overline{DBj}$ are provided for each memory cell array MCAm. In addition, each pair of data bus lines DBj, $\overline{DBj}$ are connected to a data bus amplifier DBA and a writing amplifier WA. The pair of bit lines BLi, $\overline{BLi}$ are respectively connected to a corresponding pair of data bus lines DBj, $\overline{DBj}$ through column selection switches $Q_n'$ (n=1, 2, ...). The open/close control of the column selection switches is carried out, common to all rows MCAm of the memory cell arrays, according to an output of a column decoder CD where the output of the column decoder CD is supplied through column selection lines CSLk (k=1,2, ...) to the column selection switches.

Although the construction of FIG. 1 is well known, the operation thereof is briefly reviewed below. When a word line (not shown) is selected, voltages caused by data memorized in memory cells corresponding to the selected word line, are respectively output on the pairs of bit lines BLi, $\overline{BLi}$, and then the voltages on the pairs of bit lines BLi, $\overline{BLi}$ are respectively amplified by the sense amplifiers SA. For example, when the voltage level of the column selection line CSL1 is made high (H) (i.e., is "selected") by the column decoder CD, the column selection switches $Q_1'$ to $Q_8'$ turn ON, and voltages of the bit lines BL1, $\overline{BL1}$, to BL4, $\overline{BL4}$ are output on the corresponding data bus lines DB1, $\overline{DB1}$, to DB4, $\overline{DB4}$, respectively. The voltages on the data bus lines are amplified by the data bus amplifiers DBA, and then only one amplified voltage is selected to be output to outside of the dynamic random access memory when the dynamic random access memory is a one bit output type. In addition, the above amplified voltages on the bit lines BL1, $\overline{BL1}$, to BL4, $\overline{BL4}$ are applied to the memory cells corresponding to the selected word line, and the contents of the memory cells are refreshed.

When writing data, the writing amplifier WA operates, and outputs of the writing amplifier WA are applied to the memory cell corresponding to the selected word line, through a pair of data bus lines DBj, $\overline{DBj}$, the column selection switches $Q_n'$ turned ON by the selection, and the pair of bit lines BLi, $\overline{BLi}$ connected to the pair of data bus lines DBj, $\overline{DBj}$ by the selected column selection switches $Q_n'$, and thus the above data is written in the memory cell.

Although some divided memory cell arrays have a column decoder for each row of the memory cell array, currently only one column decoder is provided for all the rows as shown in FIG. 1, to select columns in all the rows MCAm with the column selection lines extending over all the rows MCAm.

As shown in FIG. 1, a column in a conventional dynamic random access memory is selected by connecting an output of the column decoder to the column selection switch $Q_n'$ provided for each divided block of the memory cell array. The column selection switch $Q_n'$, driven by the column decoder, connects a pair of data bus lines DBj, $\overline{DBj}$ with a pair of bit lines BLi, $\overline{BLi}$ or a sense amplifier SA. When reading data, the electric charge which has been pre-charged on the pair of data bus lines DBj, $\overline{DBj}$ is discharged by the sense amplifier SA to generate an appropriate output signal to be applied to a load element connected to the pair of data bus lines DBj, $\overline{DBj}$. When writing data, flip flop circuits constituting the sense amplifier SA are driven with a large amplitude applied to the pair of data bus lines DBj, $\overline{DBj}$.

For example, when reading data memorized in a memory cell connected to a pair of bit lines BLi, $\overline{BLi}$ in the memory cell array MCA1, the column selection line CSL1 is driven by the column decoder CD, and therefore, the column selection switches $Q_1'$ and $Q_2'$ turn ON, and thus the sense amplifier SA and the pair of data bus lines DB1, $\overline{DB1}$ are connected to each other. Namely, in addition to the connection of a bit line in the pair (for example, DB1) connected to the memory cell, from which the data is required to be read by driving a word line, to one input/output terminal of the sense amplifier SA, the other bit line in the pair (for example, $\overline{DB1}$) is connected to the other input/output terminal of the sense amplifier SA to thereby balance stray capacities on the bit lines connected to both the input/output terminals.

The voltage levels of the pair of data bus lines DBj, $\overline{DBj}$ are preset to about $V_{cc}-V_{th}$ (where Vcc denotes a source voltage, and $V_{th}$ denotes a threshold voltage of a MOS transistor, for example, $V_{th}=1$ V). The sense amplifier SA draws out a voltage of one bit line of the pair of data bus lines DBj, $\overline{DBj}$ according to whether the data to be read is "0" or "1". The voltage amplitude on the pair of data bus lines is about 0.5 V.

On the other hand, when writing data, the writing amplifier WA connected to the pair of data bus lines DBj, $\overline{DBj}$, supplies a maximum amplitude, allowed from the source voltage, to the pair of data bus lines DBj, $\overline{DBj}$, and thus the outputs of the sense amplifier SA, which receive the amplitude through the column selection switch $Q_1'$ and $Q_2'$ (turned ON), is inverted according to the data to be written. The selected memory cell receives the applied voltage through a transfer gate (constituted by a MOS transistor having a gate connected to the word line), and stores the applied voltage in a capacitor thereof.

The above conventional dynamic random access memory has the following two problems. Note, these problems will not appear if the timing of signals in the dynamic random access memory is ideal, but a sufficient time margin is necessary at any time for the adjustment, and when a fast access to the memory is required, such a sufficient margin cannot be obtained.

First problem: The column selection line cannot be driven until a predetermined time (margin) has elapsed after the sense amplifier begins to operate. When this margin is to short, the sense amplifier malfunctions because the output voltage (about 200 mV) of a memory cell has not been sufficiently amplified at the beginning of the operation of the sense amplifier, and if the column selection switches $Q_n'$ are turned ON at this stage, the voltages of the data bus lines are applied to the sense amplifier, and thus the sense amplifier becomes unstable. Therefore, the column selection switches $Q_n'$ are driven 15 to 20 nsec after the sense amplifier begins to operate. Namely, conventionally, this time margin is necessary.

Second problem: Since a large amplitude voltage remains on the data bus lines after the data writing operation is completed, the following reading operation must be started after completely resetting the voltages of the data bus lines, to prevent a malfunction of the sense amplifier due to an affect of the previously written data.

As explained above, in the conventional dynamic random access memory, since the column decoder cannot be operated at the beginning of the operation of the sense amplifier, an increase of the access speed is limited.

Unexamined Japanese Patent Publication No.59-140692 discloses an example of a dynamic random access memory wherein a column selection line CLW for writing data and a column selection line CLR for reading data are provided separately, and bit lines and data bus lines are connected to each other through transistors.

FIG. 2 is a diagram showing a construction in a region corresponding to a column in a memory cell array in a dynamic random access memory having a plurality of memory cell arrays, as in the construction of FIG. 1. In FIG. 2, only one memory cell among a plurality of memory cells connected to a pair of bit lines BLi, $\overline{BLi}$ is indicated. In the construction of FIG. 2, a column selection line CLW for writing data and a column selection line CLR for reading data are provided separately. When writing data, the pair of bit lines BLi, $\overline{BLi}$ and the pair of data bus lines DBj, $\overline{DBj}$ are electrically connected to each other by controlling transistors $Q_1$ and $Q_2$ connected between the pair of bit lines BLi, $\overline{BLi}$ and the pair of data bus lines DBj, $\overline{DBj}$, by a column selection signal for writing, which signal is supplied to the transistors through the column selection line CLW for writing. When reading data, a column selection signal for reading, which signal is supplied through the column selection line CLR for reading, controls the transistors $Q_6$ and $Q_7$ where source terminals of transistors $Q_6$ and $Q_7$ are respectively connected to the pair of data bus lines DBj, $\overline{DBj}$. Drain terminals of the transistors $Q_6$ and $Q_7$ are respectively connected to source terminals of transistors $Q_8$ and $Q_9$, and gate terminals of the transistors $Q_8$ and $Q_9$ are respectively connected to the pair of bit lines BLi, $\overline{BLi}$.

Before the data reading operation, an electric charge is pre-charged at the pair of data bus lines DBj, $\overline{DBj}$ from a source Vcc through transistors $Q_3$ and $Q_4$, and the voltage levels of the pair of data bus lines DBj, $\overline{DBj}$ are maintained at a predetermined level to turn OFF the transistors $Q_3$ and $Q_4$. Then, a voltage corresponding to one bit data memorized in a capacitor C in a memory cell, is output on one of the pair of bit lines BLi, $\overline{BLi}$ connected to the capacitor C. Although not shown, another construction similar to the construction on the side of the bit line BLi is provided on the side of the bit line $\overline{BLi}$.

The above voltages output to the pair of bit lines BLi, $\overline{BLi}$ are applied to the sense amplifier SA, and gradually amplified within 15 to 20 nsec. The amplified voltage is applied to the gate terminals of the transistors $Q_8$ and $Q_9$, and thus, according to the voltages memorized in the memory cells respectively connected to the pair of bit lines BLi, $\overline{BLi}$, only one of the transistors $Q_8$ and $Q_9$ is turned ON. In this condition, transistors $Q_6$ and $Q_7$ are turned ON by setting the column selection signal for reading, which signal is supplied through the above column selection line CLR for reading, and therefore, the electric charge pre-charged to one of the pair of data bus lines DBj, $\overline{DBj}$ connected to the above transistor $Q_8$ or $Q_9$ now turned ON, is drawn out to the side of the low voltage source $V_{ss}$. Thus, the voltage of the data bus line from which the electric charge is drawn out is lowered, and a difference voltage between the pair of data bus lines DBj, $\overline{DBj}$ is amplified in the data bus amplifier DBA and then latched to detect the above one bit data memorized in the above memory cell.

FIGS. 3A to 3H are timing charts indicating the timing of a data reading operation in the construction of FIG. 2.

Since a gate voltage $\phi_R$ applied to the gate terminals of the transistors $Q_3$, $Q_4$, and $Q_5$ is changed to $V_{cc}$ (FIG. 3A) while the $\overline{RAS}$ signal is inactive (H) as shown in FIG. 3B, the transistors $Q_3$ and $Q_4$ are turned ON, and therefore, currents are supplied from the high voltage source $V_{cc}$ to the pair of data bus lines DBj, $\overline{DBj}$ through the transistor $Q_3$ and $Q_4$ to pre-charge the pair of data bus lines DBj, $\overline{DBj}$ (FIG. 3H). After this precharging, the gate voltage $\phi_R$ applied to the gate terminals of the transistors $Q_3$, $Q_4$, and $Q_5$ is changed to 0 V, to turn OFF all the transistors $Q_3$, $Q_4$, and $Q_5$. Thus, the pair of data bus lines DBj, $\overline{DBj}$ is maintained as pre-charged to the high voltage $V_{cc}$, isolated from both the high voltage source $V_{cc}$ and from each other data bus line DBj. When the word line WL is driven in the above condition (FIG. 3C), the transistor $Q_c$ connected to the word line WL at a gate terminal thereof is turned ON, and therefore, the voltage of the bit line BLi connected to the above capacitor C through the transistor $Q_c$ is lowered, for example, by about 100 mV (FIG. 3E) due to the influence of the terminal voltage of the capacitor C in the memory cell. When a source voltage $\phi_B$ supplied to the sense amplifier SA is changed to $V_{cc}$ (FIG. 3D) in the above condition, the voltage (a difference from the high voltage $V_{cc}$) of the bit line BLi is amplified (FIG. 3E). The amplified voltage is applied to the gate terminals of the transistors $Q_8$ and $Q_9$, and only one of the transistors $Q_8$ and $Q_9$ is turned ON according to the voltages memorized in the memory cells respectively connected to the pair of bit lines BLi, $\overline{BLi}$. By setting the level of the column selection line CLR for reading, to the H level after the voltage on the bit line BLi is sufficiently amplified, the transistors $Q_6$ and $Q_7$ are turned ON in the construction of FIG. 2, and the electric charge pre-charged to the data bus line connected to the above one of the transistors $Q_8$ and $Q_9$ now turned ON, is drawn out to the side of the low voltage source $V_{ss}$. Thus, the voltage of the data bus line from which the electric charge is drawn out is lowered (FIG. 3H), and the difference voltage between the pair of data bus lines DBj, $\overline{DBj}$ is amplified in the data bus amplifier DBA and latched to detect the one bit data memorized in the memory cell.

As explained above, in the construction of FIG. 2, there still remains the above-mentioned first problem that the column selection line cannot be driven until a predetermined time has elapsed after the sense amplifier begins to operate, and the above-mentioned second problem that the sense amplifier malfunctions due to the affect of the previously written data upon reading data, unless the large amplitude remaining on the data bus lines after writing data is completely reset. Namely, there is a limit to any increase of the access speed.

SUMMARY OF THE PRESENT INVENTION

The object of the present invention is to provide a dynamic random access memory wherein a signal transmission between bit lines and a data bus is carried out so that data memorized in a memory cell can be read out in a short time after a word line is activated, and a sense amplifier is not affected by a voltage remaining on the data bus after writing data.

According to the present invention, there is provided a dynamic random access memory, characterized in that said dynamic random access memory comprises: a sense amplifier connected to a bit line, a data bus line, and a reading voltage output means for changing a voltage of the data bus line according to the voltage change occurred on the bit line, the sense amplifier being activated after the reading voltage output means is activated.

According to another aspect of present invention, there is provided a dynamic random access memory, characterized in that said dynamic random access memory comprises: a capacitor provided in at least one memory cell each for memorizing one bit digital data; at least one bit line provided corresponding to the at least one memory cell; gate means, provided for each capacitor in the memory cell, for controlling an electric connection/disconnection between a terminal of the capacitor in the memory cell and the bit line corresponding to the memory cell; at least one data bus line, each provided for at least one of the bit line, a current being continuously supplied to each of the at least one data bus line from a predetermined source through a predetermined resistor; and a reading voltage output means, provided for each of the bit line, and connecting a current input terminal thereof with a data bus corresponding to the bit line, for changing a voltage of the data bus according to the voltage change at the bit line, the sense amplifier being activated after the reading voltage output means is activated.

BRIEF DESCRIPTION OF DRAWINGS

FIGS. 3A to 3H are timing charts indicating timing of a data reading operation in the construction of FIG. 2;

FIGS. 10A to 10I and 11A to 11J are timing diagrams indicating timings in the embodiment of the present invention.

DETAILED DESCRIPTION OF THE PRESENT INVENTION

Figure 1:
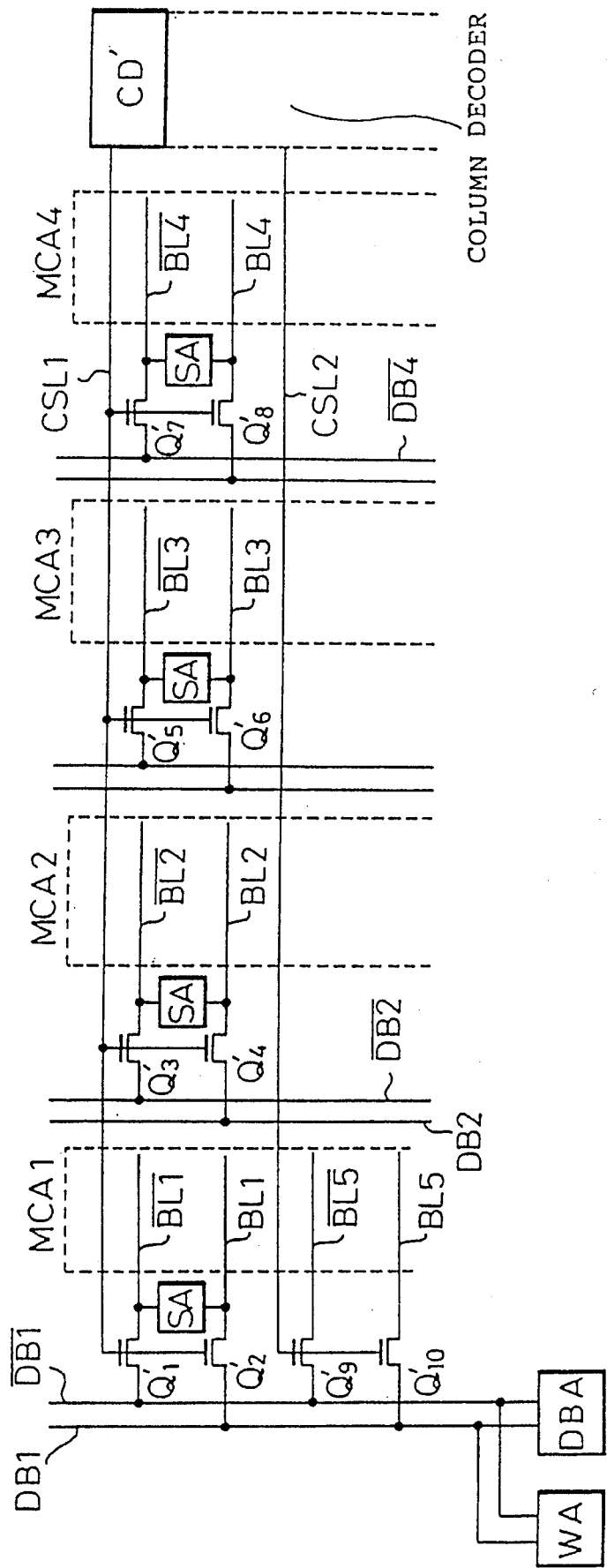
FIG. 1 is a diagram indicating an example of the dynamic random access memory having the divided cell array structure.
Figure 4:
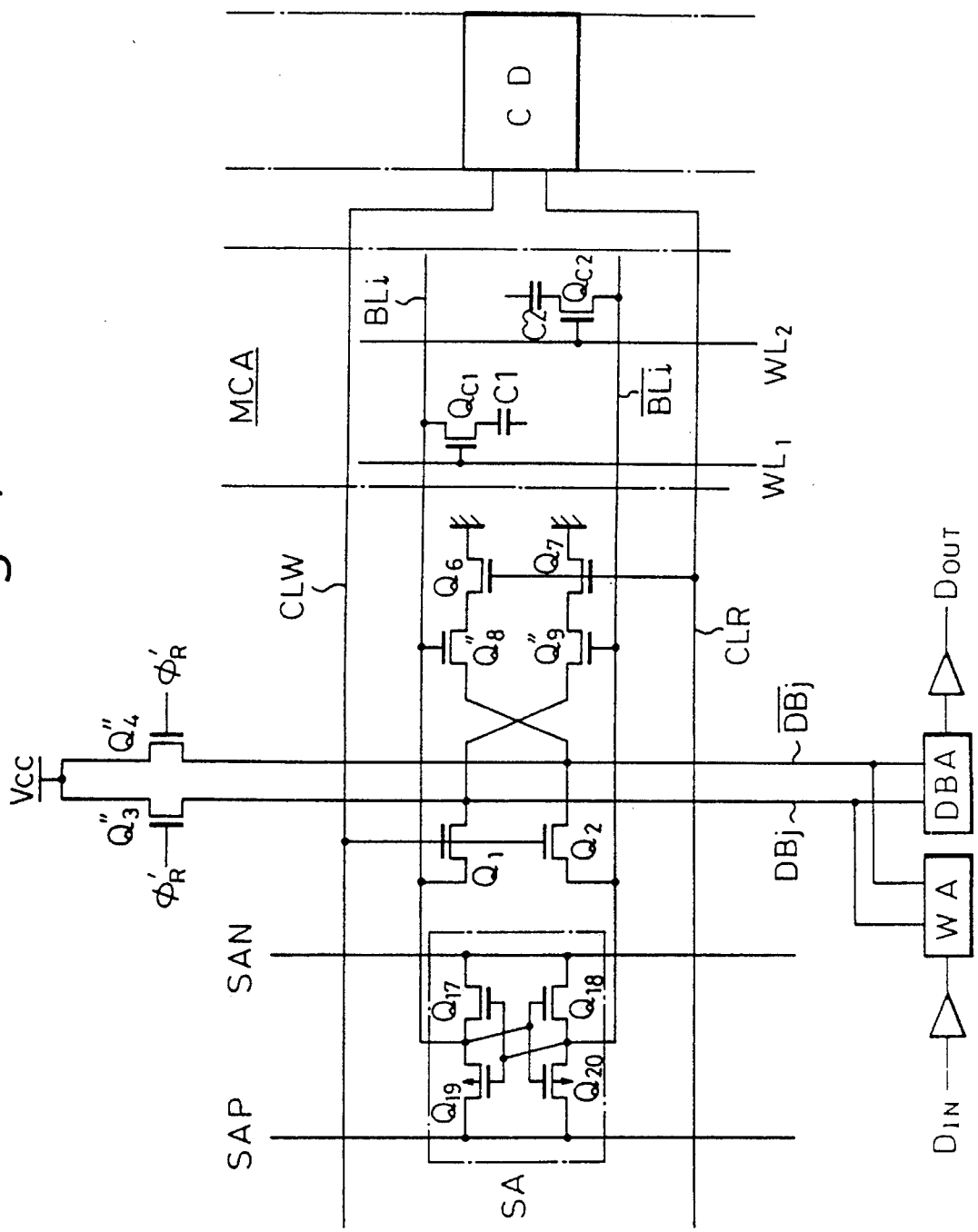
FIG. 4 is a diagram indicating a construction of an embodiment of the present invention.

FIG. 4 is a diagram indicating a construction of an embodiment of the present invention. FIG. 4 shows a construction in a region corresponding to a column in a memory cell array in a dynamic random access memory having a plurality of memory cell arrays as in the construction of FIG. 1. In FIG. 4, only one pair of memory cells among a plurality of pairs of memory cells connected to a pair of bit lines BLi, $\overline{BLi}$ is indicated. Also, in FIG. 4, elements having the same references as FIG. 2, respectively, function in the same way as the corresponding elements in the construction of FIG. 2.

Figure 2:
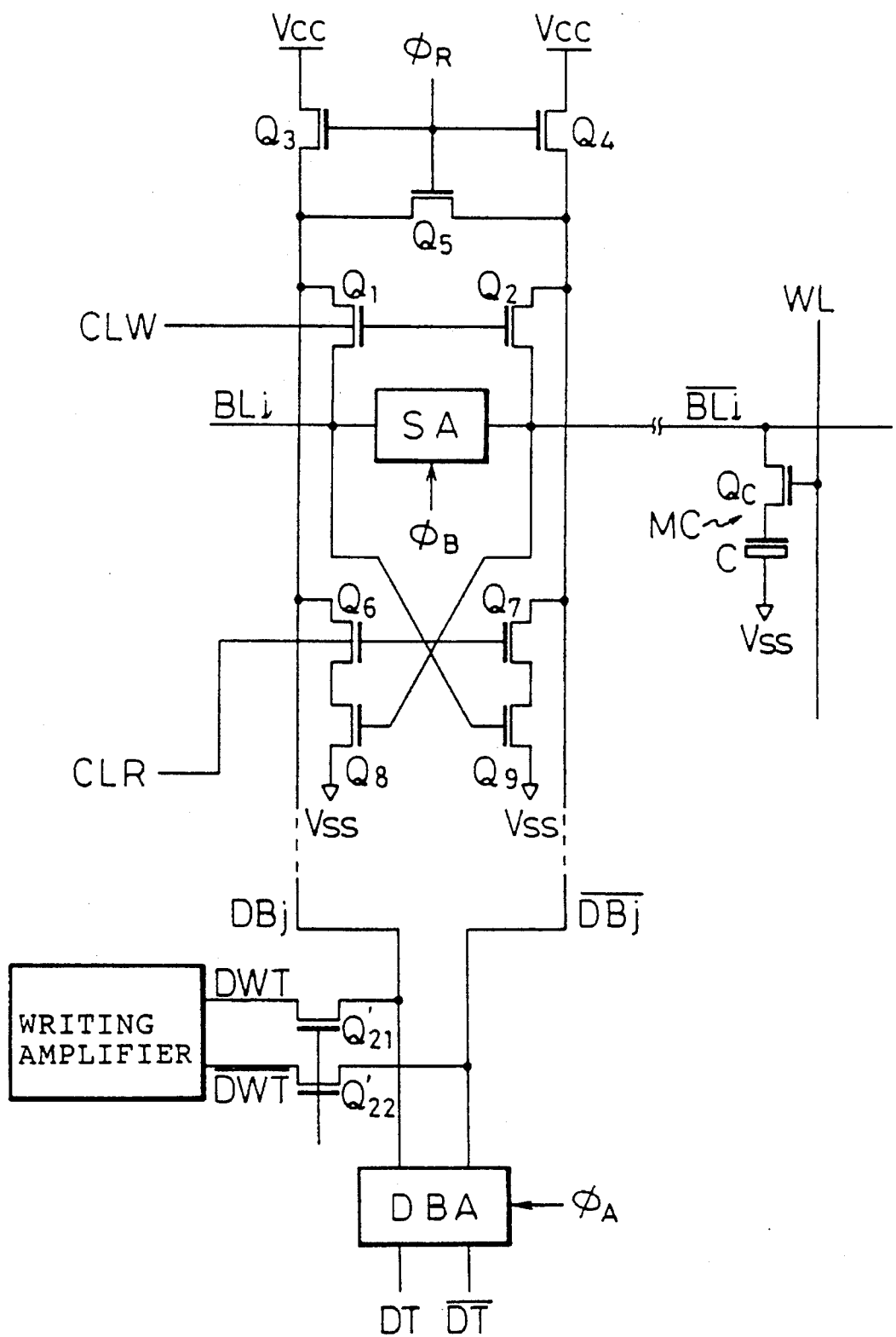
FIG. 2 is a diagram showing a construction in a region corresponding to a column in a memory cell array in a dynamic random access memory having a plurality of memory cell arrays as in the construction of FIG. 1.

In the construction of FIG. 4, different from the conventional construction of FIG. 2, the data bus lines DBj, $\overline{DBj}$ are connected to a high voltage source $V_{cc}$ through transistors $Q_3'$ and $Q_4'$ respectively functioning as a resistor having a constant resistance to receive a supply of a current. Namely, in the construction of FIG. 4, the data bus lines are not pre-charged before a data reading operation.

In the construction of FIG. 4, a column selection line CLW for writing data and a column selection line CLR for reading data are separately provided. When writing data, the pair of bit lines BLi, $\overline{BLi}$ and the pair of data bus lines DBj, $\overline{DBj}$ are electrically connected to each other by controlling transistors $Q_1$ and $Q_2$ connected between the pair of bit lines BLi, $\overline{BLi}$ and the pair of data bus lines DBj, $\overline{DBj}$, by a column selection signal for writing, which signal is supplied to the transistors through the column selection line CLW for writing. When reading data, a column selection signal for reading, which signal is supplied through the column selection line CLR for reading, controls the transistors $Q_6$ and $Q_7$ where source terminals of transistors $Q_6$ and $Q_7$ are respectively connected to the pair of data bus lines DBj, $\overline{DBj}$. Drain terminals of the transistors $Q_6$ and $Q_7$ are respectively connected to source terminals of transistors $Q_8''$ and $Q_9''$, and gate terminals of the transistors $Q_8''$ and $Q_9''$ are respectively connected to the pair of bit lines BLi, $\overline{BLi}$.

When reading data, the level of the word lines WL1 and WL2 connected to objective memory cells are made H (high), and the corresponding transfer gates $Q_{C1}$ and $Q_{C2}$ are turned ON, whereby voltages according to one bit data memorized in capacitors C1 and C2 in the memory cells are output at the pair of bit lines BLi, $\overline{BLi}$.

The above voltages output at the pair of bit lines BLi, $\overline{BLi}$ are applied to the sense amplifier SA, and at the same time, are applied to the gate terminals of the transistors $Q_8''$ and $Q_9''$. The source-drain resistance in one of the transistors $Q_8''$ and $Q_9''$ receiving at a gate terminal thereof the voltage of one of the pair of bit lines BLi, $\overline{BLi}$ to one of the above memory cells memorizing a voltage of the H level, begins to gradually decrease when the levels of the above word lines WL1 or WL2 are made H. If the level of the column selection signal for reading, which signal is supplied through the column selection line for reading CLR, is at the H level, the voltage at an input point of the data bus amplifier DBA whereat one of the data bus lines connected to the above transistor is connected to the data bus amplifier DBA, falls. A difference voltage on the pair of data bus lines DBj, $\overline{DBj}$, generated due to the above voltage fall, is amplified by the data bus amplifier DBA and then latched to detect the one bit data memorized in the memory cells. Namely, in response to a later timing of the timing at which the level of the word line WL1 or WL2 is made H, and the timing at which the column selection signal for reading, which signal is supplied through the column selection line CLR for reading, is made H, the difference voltage corresponding to the one bit data memorized in the memory cells appears at the input point to the data buffer DBA on the data bus line, and the appeared difference voltage is detected by the data buffer DBA.

Further, when transfer conductances $g_m$ of the transistors $Q_8''$ and $Q_9''$ are made larger (in particular, larger than transfer conductances $g_m$ of the transistors $Q_{17}$ and $Q_{18}$ constituting the sense amplifier SA), the driving of the pair of data bus lines DBj, $\overline{DBj}$ in response to the voltages of the pair of bit lines BLi, $\overline{BLi}$ is made faster, and the access speed of the dynamic random access memory is greatly increased. Also, when the transfer conductances $g_m$ of the transistors $Q_{17}$ and $Q_{18}$ in the sense amplifier SA are too large, the flip flop circuit in the sense amplifier SA cannot be inverted, to make the data writing operation difficult.

The sense amplifier SA in the construction of FIG. 4, is exclusively used for refreshing the content of the memory cells after the data in the memory cells have been read out, as in the construction of FIG. 2, and for amplifying the voltages output on the pair of bit lines BLi, $\overline{BLi}$ through the pair of data bus lines DBj, $\overline{DBj}$ from the writing amplifier WA to write the amplified voltages in the memory cells when writing data. Namely, in the construction of FIG. 4, the voltages on the pair of bit lines BLi, $\overline{BLi}$ are applied through the pair of data bus lines DBj, $\overline{DBj}$ to the data buffer DBA to be detected by the data buffer DBA before the voltages are amplified by the sense amplifier SA. In FIG. 4, SAP and SAN denote a high voltage and a low voltage power supply line to the sense amplifier SA, respectively.

Figure 5:
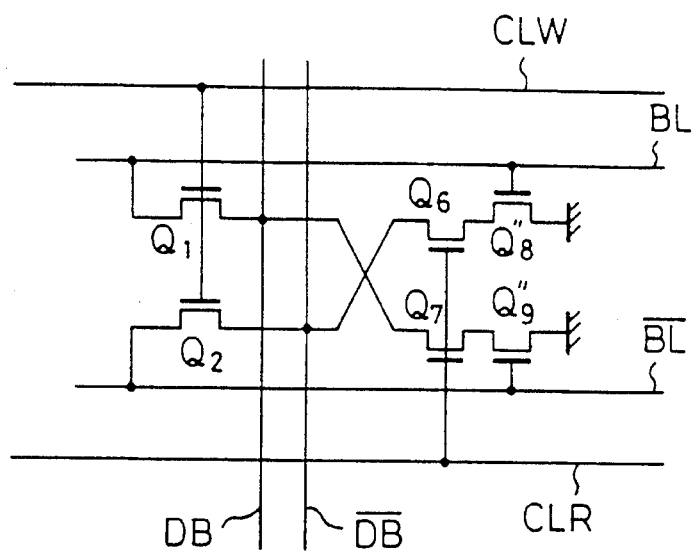
FIG. 5 is a diagram indicating a variation of the construction of FIG. 4.

As indicated in FIG. 5, in each of the series connection of the transistors $Q_8''$ and $Q_6$, and the series connection of the transistors $Q_9''$ and $Q_7$, the order of the connection of the transistors may be changed.

On the other hand, in the conventional construction of FIG. 2, wherein the draw out of the pre-charged electric charge from one of the pair of data bus lines DBj, $\overline{DBj}$ is detected when reading data, the outputs of the sense amplifier SA are not stable before the amplification of the voltages on the pair of bit lines BLi, $\overline{BLi}$ is completed by the sense amplifier SA. Therefore, the voltage changes on the pair of bit lines BLi, $\overline{BLi}$ cannot be output on the pair of data bus lines DBj, $\overline{DBj}$ by changing the level of the column selection signal for reading, supplied through the column selection line CLR for reading, until the amplification of the voltages on the pair of bit lines BLi, $\overline{BLi}$ is completed. As explained before, it takes, for example, 15 to 20 nsec, to amplify the voltages on the pair of bit lines BLi, $\overline{BLi}$ by the sense amplifier SA. Therefore, the time needed for reading data is greatly reduced in the construction of FIG. 4, compared with the conventional construction of FIG. 2.

Figure 6:
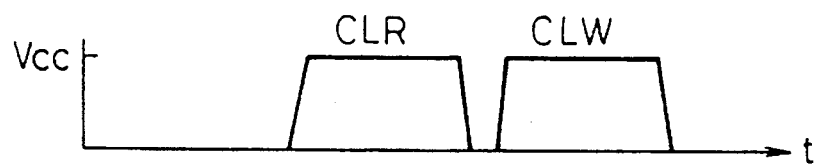
FIG. 6 is a timing diagram indicating a conventional read modify write operation in the construction of FIG. 2.
Figure 7:
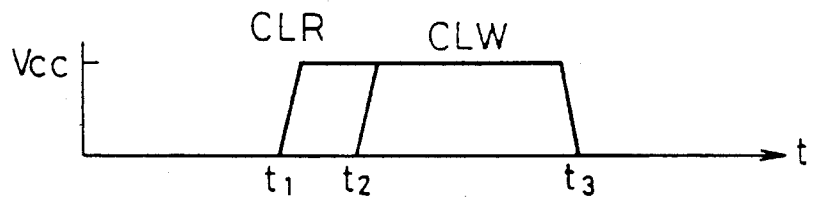
FIG. 7 is a diagram indicating a read modify write operation in the construction of FIG. 4.

FIG. 6 is a timing diagram indicating a conventional read modify write operation in the construction of FIG. 2. Since, according to the conventional construction, the column selection signal for reading on the column selection line CLR for reading must be maintained at the H level until the voltages on the pair of bit lines BLi, $\overline{BLi}$ are amplified by the sense amplifier SA, and then the amplified difference voltage on the pair of bit lines BLi, $\overline{BLi}$ is detected through the pair of data bus lines DBj, $\overline{DBj}$, the activation of the column selection signal for writing, which signal is supplied through the column selection line CLW for writing, can be carried out after the above operation is completed as indicated in FIG. 6. On the other hand, according to the construction of FIG. 4, the data reading operation can be completed without waiting for the amplification by the sense amplifier SA after the column selection signal for reading is applied through the column selection line CLR for reading. Therefore, as indicated in FIG. 7, the data writing operation can be started by changing the level of the column selection signal for writing, which signal is supplied through the column selection line CLW for writing, to the H level, immediately after the above data reading operation is completed (time $t_2$ in FIG. 7), to carry out a read modify write operation wherein a data writing operation follows a data reading operation. In addition, when the level of the column selection signal for writing is changed to the H level, a write enable signal WE, which signal is supplied to the dynamic random access memory, is also changed from an inactive level to an active level, and thus the read modify write operation can be carried out faster.

Figure 8:
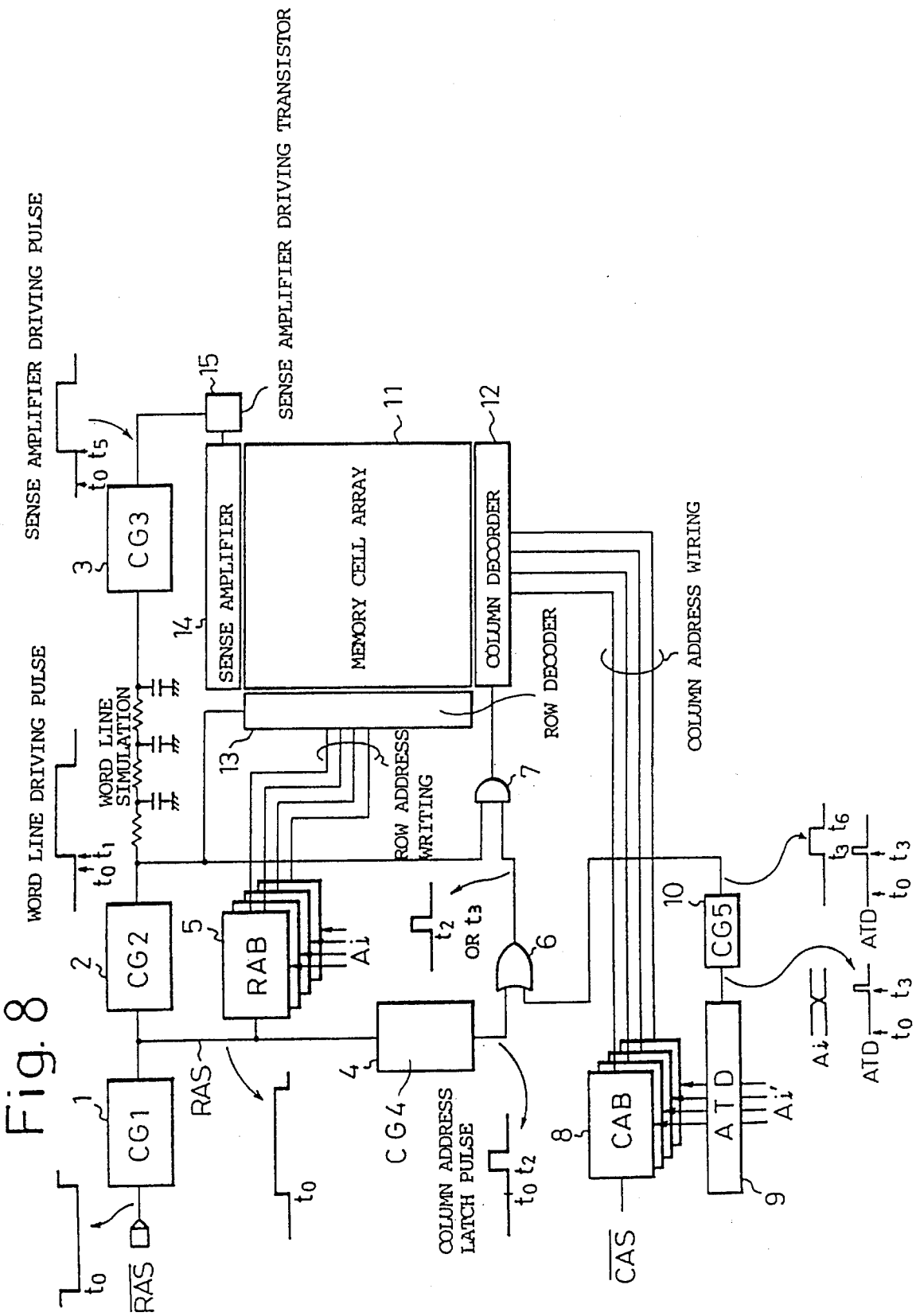
FIG. 8 is a diagram indicating a whole construction of the dynamic random access memory having a construction as FIG. 2, together with a control circuit generating a control signal.

FIG. 8 is a diagram indicating a whole construction of the dynamic random access memory having a construction as FIG. 2, together with a control circuit generating a control signal.

In FIG. 8, reference numerals 1, 2, 3, 4, and 10 each denote a clock generation circuit, 5 denotes a row address buffer RAB, 6 denotes an OR gate, 7 denotes an AND gate, 8 denotes a column address buffer CAB, 9 denotes an address transition detection circuit, 11 denotes a memory cell array, 12 denotes a column decoder, 13 denotes a row decoder, 14 denotes a sense amplifier, and 15 denotes a sense amplifier driving transistor.

A $\overline{RAS}$ (row address strobe) clock, applied from outside, is converted to an in-chip clock signal RAS by the clock generation circuit CG1, and the in-chip clock signal is applied to the clock generation circuits CG2 and CG4, and the row address buffer RAB.

An row address Ai is applied to the row address buffer RAB from a CPU, not shown, and the row address Ai is latched in the row address buffer RAB when ($t_0$) the RAS clock signal transits to an active state (rises). The latched row address Ai is supplied to the row decoder 13, and the row decoder 13 decodes the row address Ai.

On the other hand, When the clock generation circuit CG2 receives the above RAS clock signal, the clock generation circuit CG2 outputs a word line driving pulse which rises at the time $t_1$. The word line driving pulse is applied to the row decoder 13 and one input terminal of the AND gate 7. The row decoder 13 decodes the above row address Ai to drive the aforementioned word line in the memory cell array 11 (FIG. 4) according to the decoded result, synchronized with a leading edge of the above word line driving pulse.

The output of the clock generation circuit CG2 is also supplied to the clock generation circuit CG3 through a word line simulator which simulates a delay caused in the operation of driving the word lines in the actual memory cell arrays. The clock generation circuit CG3 outputs a sense amplifier driving pulse which rises (at $t_5$ in FIG. 8) in response to a leading edge of the output of the clock generation circuit CG2 after being delayed by the word line simulator. The sense amplifier driving transistor 15 is driven by the sense amplifier driving pulse, and an electric power for the memory cell array 11 is supplied through the above-mentioned high voltage supply line SAP and the low voltage supply line SAN to the sense amplifier 14, to drive the sense amplifier SA.

According to general standards for dynamic random access memories, first a row address Ai is supplied from an address bus and then, after a predetermined time has elapsed, (one or more) column addresses Ai' are supplied in turn. Generally, a change in addresses supplied from the address bus is detected by the address transition detection circuit 9, and an ATD pulse is output from the address transition detection circuit 9 for each detection of the change of the address. The width of the ATD pulse is widened in the clock generation circuit CGS, and then the widened pulse is applied to one input terminal of the OR gate 6. In FIG. 8, the ATD pulse rises at time $t_3$.

When a first column address Ai", which is supplied following the row address Ai, is the same as the row address Ai, the replacement of the row address Ai with the column address Ai' having the same value cannot be detected by the address transition detection circuit 9. Therefore, the clock generation circuit CG4 is provided for detecting a lapse of a constant time. Namely, the clock generation circuit CG4 outputs a column address latch pulse rising at the time $t_2$, which is a predetermined time after the time $t_0$ of the rising of the above RAS clock signal, corresponding to the above constant time. The column address latch pulse is applied to the other input terminal of the OR gate 6. Thus, the OR gate 6 outputs a pulse rising at timing when the address value supplied from the address bus changes, or when the address supplied from the address bus is changed from a row address Ai to a column address Ai'. Therefore, this pulse provides a timing when each column address Ai' is latched. The above pulse is applied to the other input terminal of the AND gate 7. The AND gate 7 is provided for adjusting the timing when a column address Ai' is to be latched, so that the timing is not too early compared with the timing of the driving of the word line, and the output of the AND gate 7 is supplied to the column decoder 12 as a timing signal (column gate driving pulse) for latching a column address.

The column address buffer CAB, after receiving a $\overline{CAS}$ (column address strobe) clock signal supplied from outside, latches in turns the column addresses Ai' supplied from the address bus through the above address transition detection circuit 9, and supplies the latched addresses to the column decoder 12. The column decoder 12 decodes the column address Ai' supplied from the column address buffer CAB, and drives the column selection line CLW for writing, or the column selection line CLR for reading, at the timing of the leading edge of the above output of the AND gate 7. Although not shown, the column decoder 12 drives the column selection line CLW for writing, or the column selection line CLR for reading according to whether or not the write enable signal WE supplied from outside is active.

Thus, according to the present embodiment, the memory cell array 11 having a construction as shown in FIG. 4, is controlled so that the timing when driving the word lines and the timing when driving the column selection line CLW for writing, or the column selection line CLR for reading, are approximately the same, and the voltages on the pair of bit lines BLi, $\overline{BLi}$ can be read through the pair of data bus lines DBj, $\overline{DBj}$ before the voltages on the pair of bit lines BLi, $\overline{BLi}$ are amplified by the sense amplifier SA.

Figure 9:
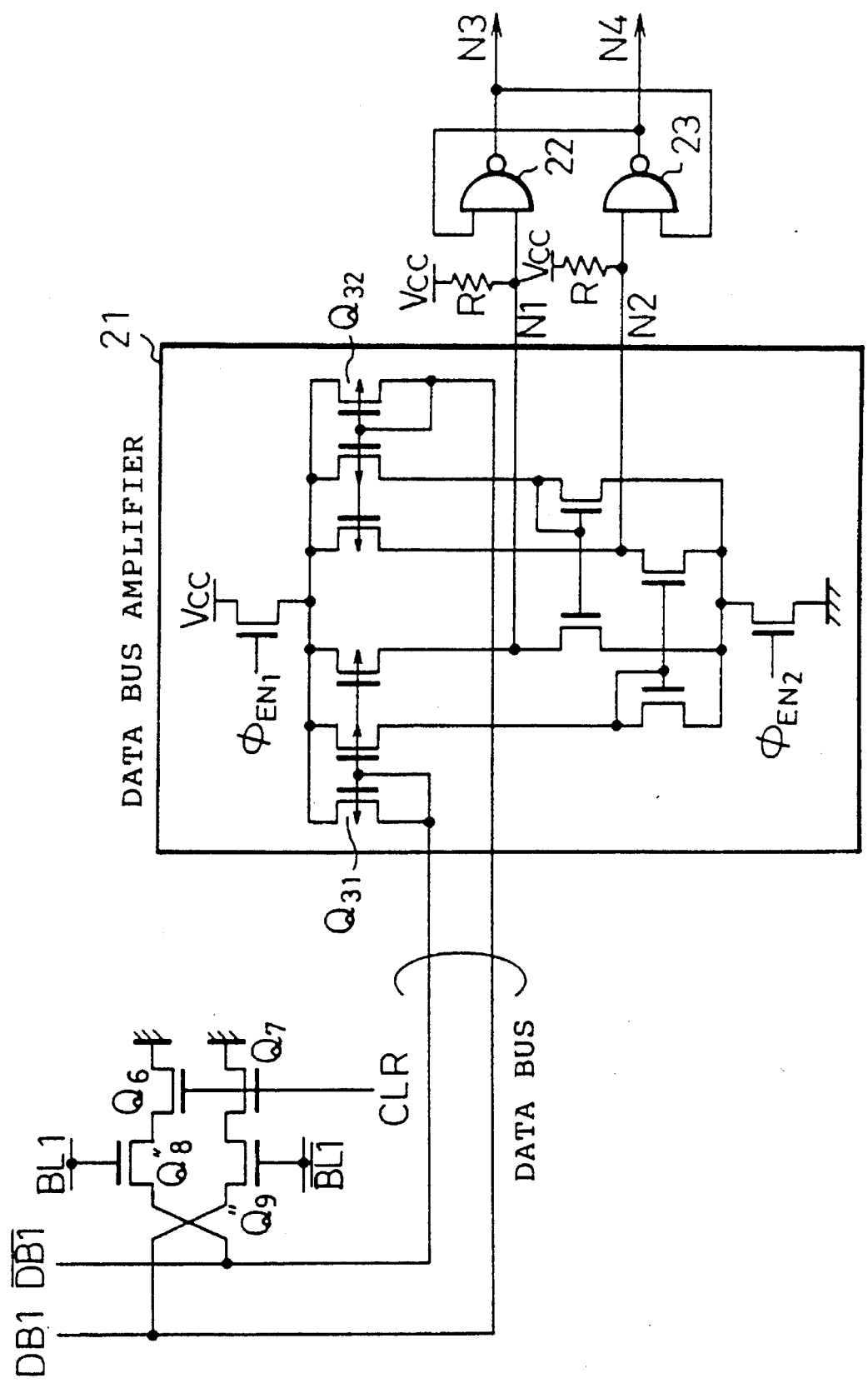
FIG. 9 is a diagram indicating example constructions of the data bus amplifier DBA and the data latch circuit in FIG. 4.

FIG. 9 is a diagram indicating example constructions of the data bus amplifier DBA and a data latch circuit provided on the output side of the data bus amplifier DBA. As indicated in FIG. 9, the data bus amplifier 21 is constituted by a well known differential amplifier, and the data latch circuit is constituted by two NAND circuits 22 and 23.

FIGS. 10A to 10I are timing diagrams indicating waveforms and timing of the signals used in the data reading operation in the constructions of FIGS. 4, 8, and 9. FIGS. 11A to 11J are more detailed timing diagrams indicating waveforms and timing of the signals used in the data reading operation in the constructions of FIGS. 4, 8, and 9.

In an initial state, the voltage of the data bus is reset to, for example, $V_{cc}-V_{th}=2.6$ V, when the source voltage is $V_{cc}=3.3$ V, and a threshold level of the PMOS transistor in the input stage of the data bus amplifier 21 is $V_{th}=0.7$ V.

When an address signal on the address bus changes as indicated in FIG. 11A, i.e., when the address signal on the address bus changes from a row address to a column address, or when the address signal on the address bus changes from a column address to another column address, the address transition detection circuit 9 of FIG. 9 detects the change and outputs an ATD pulse. In response to the above, the clock generation circuit CG5 outputs a pulse having a predetermined width (rising at the time $t_3$ and falling at the time $t_6$ in the example of FIG. 11B).

On the other hand, a word line driving pulse output from the clock generation circuit CG2 rises at the time $t_1$ (FIG. 11C) in response to a transition of the above-mentioned $\overline{RAS}$ signal to the L level at the time $t_0$. In response to the rising, the row decoder 13 drives a word line corresponding to an row address applied from the row address buffer 5 to the row decoder 13. Thereby, as indicated in FIG. 11F, the voltage of the word line is raised to the H level, and the transistor $Q_c$, which is connected with the word line WL at a gate terminal thereof, turns ON. Then, the voltage of the bit line $\overline{BLi}$ connected to the capacitor C through the transistor $Q_c$, is lowered by, for example, about 100 mV (FIG. 11G), 0 affected by the terminal voltage of the capacitor C in the memory cell. The voltages of the bit lines BLi and $\overline{BLi}$ forming a pair, are respectively applied to the gate terminals of the transistors $Q_8"$ and $Q_9"$, and thereby the source-drain resistances of the transistors $Q_8"$ and $Q_9"$, are respectively lowered in response to the voltages of the corresponding bit lines BLi, $\overline{BLi}$.

When both the inputs of the AND gate 7, i.e., both the word line driving pulse and the output of the OR gate 6 (which transits to the H level in response to the output of the clock generation circuit CG5) transit to the H level (at the time $t_4$) as indicated in FIG. 11D, the output of the AND gate transits to the H level. In response to the above, the column decoder 12 changes a voltage level of a column selection line CLR for reading, or a column selection line CLW for writing, corresponding to an column address which is applied from the column address buffer 8 to the column decoder 12, to the H level. Although not shown, a write enable signal WE indicating which of a data writing or data reading is to be carried out in the dynamic random access memory, is applied to the column decoder 12. The column decoder 12 drives the column selection line CLW for writing, or the column selection line CLR for reading according to whether or not the write enable signal WE supplied from outside is active. Since, in FIGS. 11A to 11J, the data reading operation is indicated, the column selection line CLR for reading is driven in response to the transition of the output of the AND gate 7 to the H level, to turn ON the transistors $Q_6$ and $Q_7$. Since the sense amplifier SA has not been driven at this time, although the transistors $Q_8"$ and $Q_9"$, which receive the voltages of the bit lines BLi, $\overline{\text{BLi}}$ at their gate terminals, respectively, amplify the voltages of the bit lines BLi, $\overline{\text{BLi}}$, the voltage on the bit lines are, for example, BL1 1.3 V and $\overline{\text{BLi}}$ 1.2 V, where the output voltage of the memory cell is assumed to be 1000 mV. Then, both the transistors $Q_8$" and $Q_9$" are ON, and currents according to the voltages of the bit lines BLi, $\overline{\text{BLi}}$, flow in the pair of data bus lines DBj, $\overline{\text{DBj}}$, respectively. The data bus amplifier 21, which is a differential amplifier, detects a difference current between the currents flowing the data bus lines DBj, $\overline{\text{DBj}}$, and thereby the output N2 of the data bus amplifier 21 falls.

In the example of FIG. 9, transistors $Q_{31}$ and $Q_{32}$ in the input stage of the data bus amplifier 21, supplies the currents to the data bus lines DBj, $\overline{\text{DBj}}$. (Since, in this case, the transistors $Q_{31}$ and $Q_{32}$ function in the same way as the transistors $Q_3$ and $Q_4$ in FIG. 4, the transistors $Q_3$ and $Q_4$, and the high voltage source $V_{cc}$ are dispensable when the data bus amplifier DBA in FIG. 4 has the construction as indicated in FIG. 9.) Although parasitic resistances due to wiring exist between the transistors $Q_8$" and $Q_9$" and the above transistors $Q_{31}$ and $Q_{32}$, as indicated between α and β in FIG. 1, the voltage of the data bus line DB1 corresponding to the bit line on the side of the memory cell having a lower output voltage, momentarily falls, and recovers immediately after the momentary fall.

Next, when the sense amplifier SA is driven at the time $t_5$, the voltage of the bit line $\overline{\text{BL1}}$ is further lowered, and when the voltage falls below a threshold level of the transistor $Q_{14}$, the transistor $Q_{14}$ is cut off to stop the current on the data bus line DB1. Thereby, the voltage of the data bus line DB1 increases toward $V_{cc}-V_{th}$. The outputs N1 and N2 of the data bus amplifier 21 are controlled by the currents flowing in the data bus lines DBj, $\overline{\text{DBj}}$, and the voltage of the data bus line $\overline{\text{DB1}}$ reaches $V_{cc}-V_{th}$ when the current in the data bus line $\overline{\text{DB1}}$ stops (β in FIG. 11H).

When the column gate driving pulse goes back to the L level at the time $t_6$ (when the driving of the column gate is completed), the transistors $Q_6$ and $Q_7$ turn OFF, and the currents in the data bus lines DBj, $\overline{\text{DBj}}$ stop. Therefore, the voltage of the data bus line DB1 rises toward $V_{cc}-V_{th}$.

As explained above, according to the embodiment of the present invention, in a data reading operation the column decoder is driven to drive a column selection line CLR for reading, without waiting for an amplification of voltages of bit lines by a sense amplifier. Therefore, the voltages of the bit lines before amplified by the sense amplifier, are amplified by the transistors $Q_8$" and $Q_9$" to reflect the voltages of the pair of bit lines on the voltages of the corresponding pair of data bus lines. Then, the digital data in the memory cell is read based on a difference of the voltages on the data bus lines. Since the data can be read without waiting for the amplification of the voltages of the bit lines by the sense amplifier, the data reading time is greatly reduced.

The above reduction of the data reading time is impossible in the conventional construction of FIG. 2. In the construction of FIG. 2, a pair of bit lines are pre-charged before the word line is driven, and then the pre-charged lines are isolated from the voltage source, and from each other line. Thereafter, an electric charge in one of the data bus lines is drawn out by a transistor (one of the transistors $Q_8$ and $Q_9$ in FIG. 2) driven by the voltages of the bit lines after the voltages of the bit lines are amplified by the sense amplifier. In the construction of FIG. 2, even when the column selection line CLR for reading is driven before the voltages of the bit lines are amplified by the sense amplifier, the sense amplifier becomes unstable, and the voltages of the bit lines cannot be exactly reflected on the data bus lines.

In the construction according to the present invention, currents are continuously supplied to the pair of data bus lines through predetermined resistances (the transistors $Q_3$ and $Q_4$ in FIG. 4, or transistors $Q_{31}$ and $Q_{32}$ in FIG. 9), and the voltages of the bit lines are immediately reflected on the voltages of the data bus lines through the amplification of the voltages of the bit lines by the transistors $Q_8$" and $Q_9$", and thus, the digital data can be read from the voltages of the data bus lines.

Figure 12:
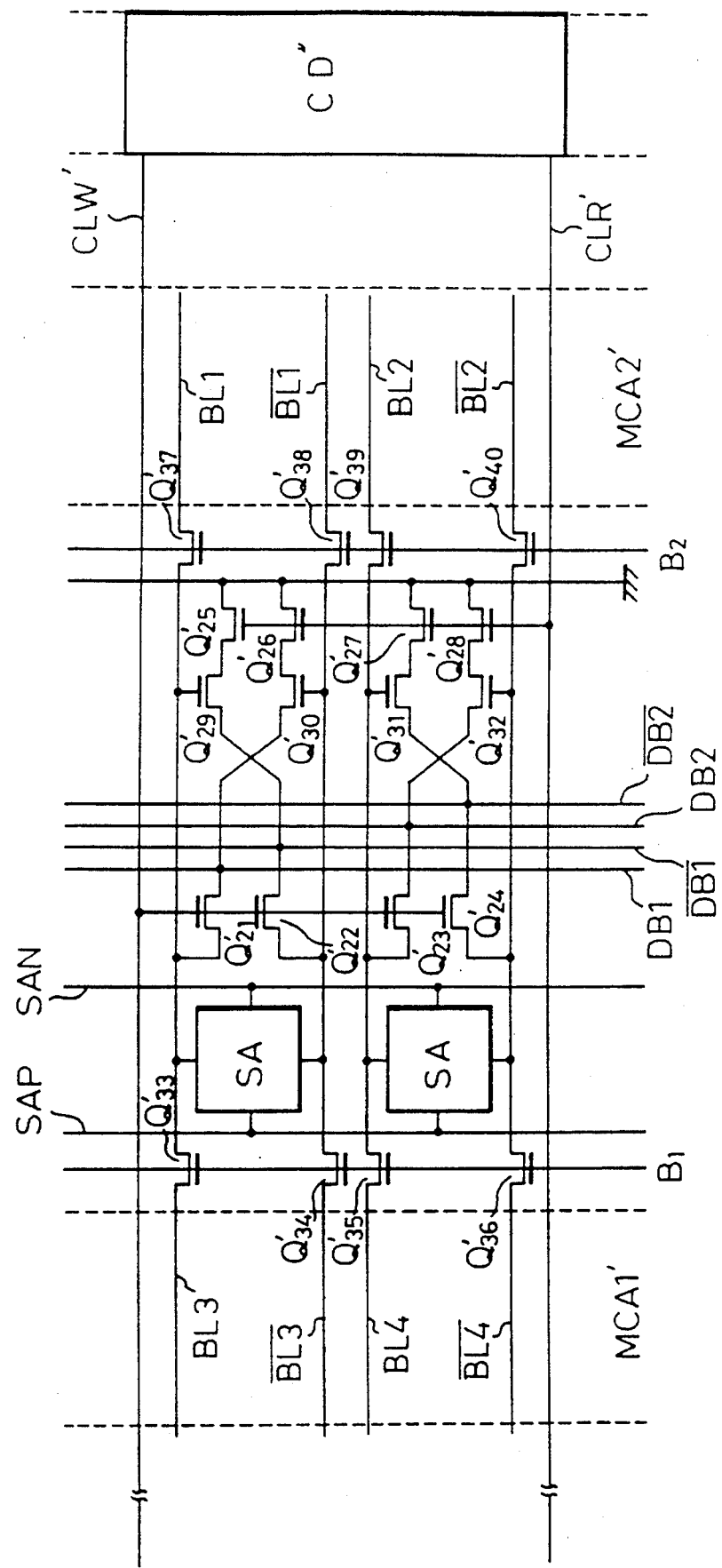
FIGS. 12, 13, 14, and 15 are diagrams indicating example variations of the embodiment of the present invention.

FIG. 12 is a diagram indicating a construction of another embodiment of the present invention. A called shared sense amplifier structure is applied to the construction of FIG. 12, wherein a sense amplifier in each column is shared by the memory cell arrays MCA1' and MCA2' on the right and left sides of the sense amplifier. Therefore, control is carried out regarding which of the memory cell arrays MCA1' and MCA2' is to be selected, by providing block selection lines B1 and B2. The transistors $Q_{33}$' to $Q_{36}$', and $Q_{37}$' to $Q_{40}$' are arranged between the memory cell side of the bit lines and the reading/writing control circuit side of the bit lines, for the block selection lines on the right and left sides, respectively, whereby, it is determined which of the memory cell arrays MCA1' and MCA2' is to be connected to the reading/writing control circuit side. In addition, two pairs of bit lines pair of bit lines BL1, $\overline{\text{BL1}}$, BL2, $\overline{\text{BL2}}$, corresponding to two column addresses are simultaneously selected by a column selection line CLW' for writing, and a column selection line CLR for reading. Further, the data bus lines DBj, $\overline{\text{DBj}}$ are provided for the respective bit lines BL1, $\overline{\text{BL1}}$, BL2, $\overline{\text{BL2}}$. Since the sense amplifier SA in each column is shared by the memory cell arrays on the right and left sides, and bit lines in two columns can be simultaneously accessed by the column selection line CLW for writing, and the column selection line CLR for reading, the number of the column selection lines is the same as the construction of FIG. 2, although column selection lines are separately provided for writing and for reading.

Figure 13:
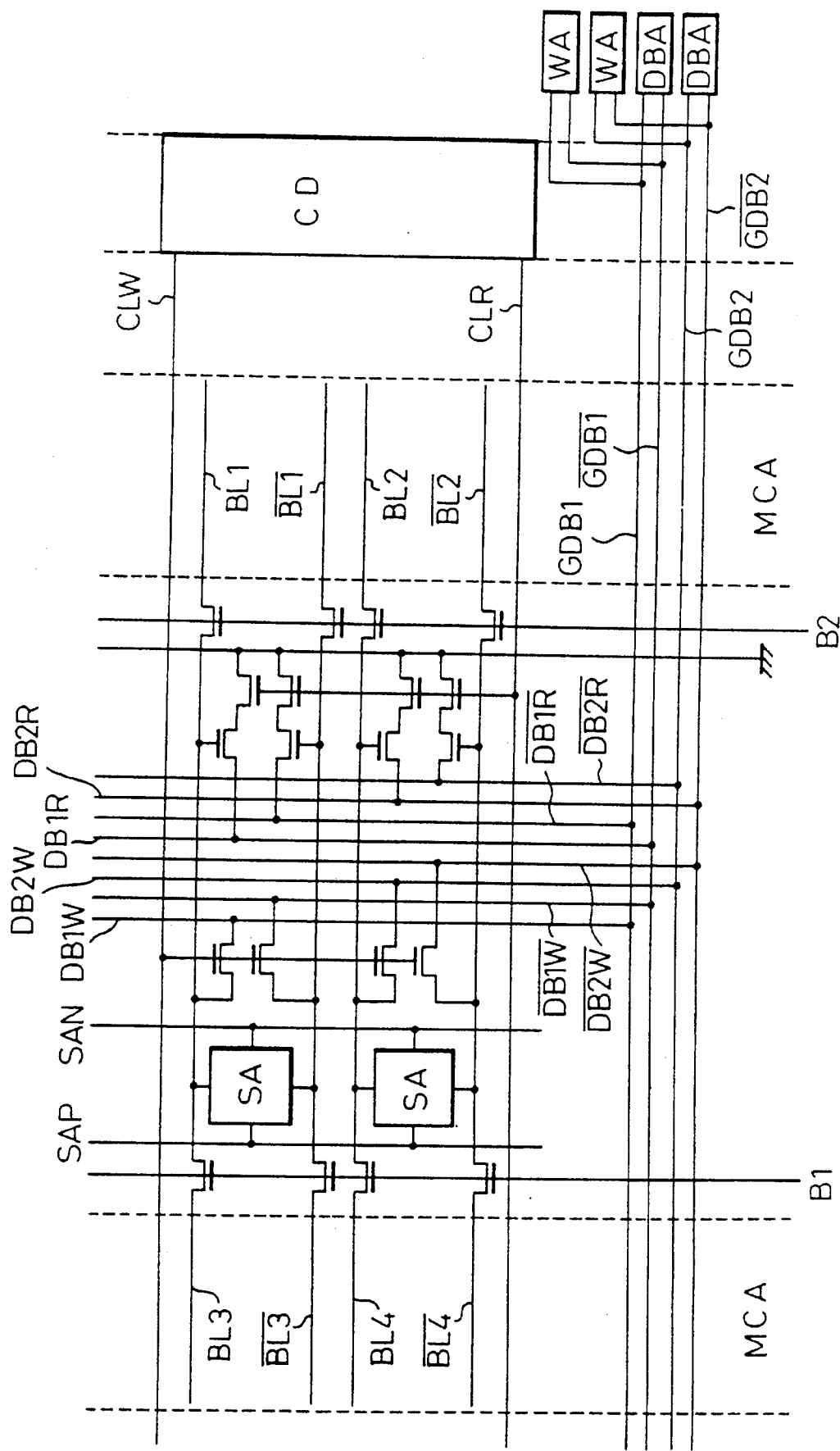

FIG. 13 is a diagram indicating a construction of a variation of the construction of FIG. 12. In the construction of FIG. 13, data bus lines DB1W, $\overline{\text{DB1W}}$ for writing, and data bus lines DB1R, $\overline{\text{DB1R}}$ for reading, are separately provided for each bit line BLi, $\overline{\text{BLi}}$. Further, the data bus lines for writing and reading are respectively connected through two pairs of global data bus lines GDB1, $\overline{\text{GDB1}}$, GDB2, $\overline{\text{GDB2}}$ to a writing amplifier WA and a data bus amplifier DBA.

Figure 14:
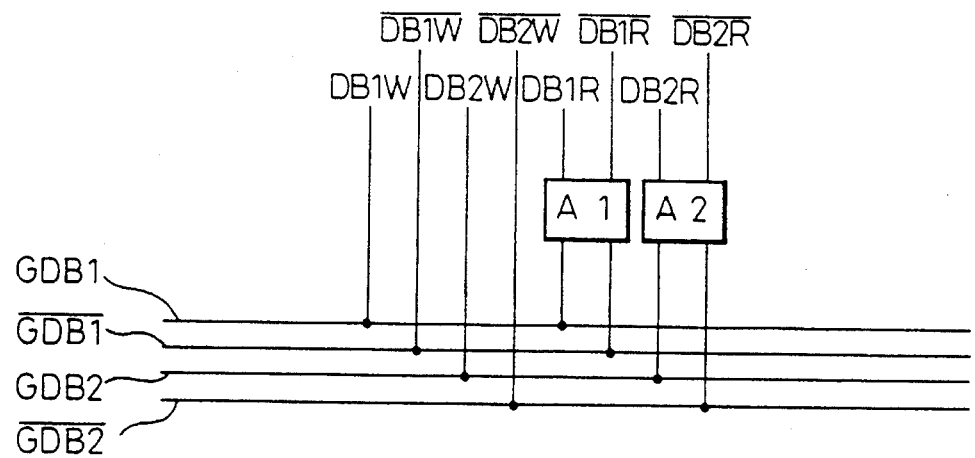

FIG. 14 is a diagram indicating a construction of a variation of the construction of FIG. 13. In the construction of FIG. 14, preamplifiers A1 and A2 are provided between the data bus lines DB2, $\overline{\text{DB2}}$ for reading, and the global data bus lines for reading data GDB2, $\overline{\text{GDB2}}$, and thereby the signals read from the data bus lines are amplified. The above preamplifiers between the data bus lines and the global data bus lines may or may not be provided when a powerful writing amplifier WA is provided to drive the data bus lines.

Figure 15:
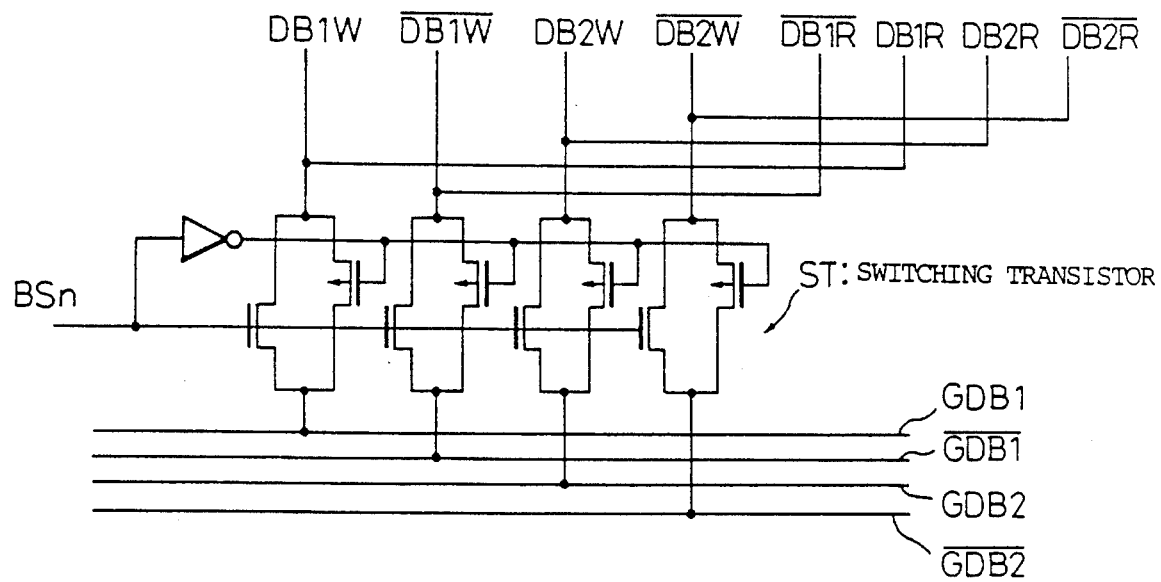

FIG. 15 is a diagram indicating a construction of another variation of the construction of FIG. 13. In the construction of FIG. 15, switching transistors ST are provided at the respective connection points of the data bus lines for writing data DB1W, $\overline{\text{DB1W}}$, and the data bus lines for reading data DB2R, $\overline{\text{DB2R}}$ with the global data bus lines GDB1, $\overline{\text{GDB1}}$, GDB2, $\overline{\text{GDB2}}$. When accessing the dynamic random access memory, a switch control signal BSn selecting four pairs of bit lines BLi, $\overline{\text{BLi}}$ as indicated in FIG. 13, is applied to the switching transistors ST. Consequently, only four pairs of bit lines BLi, $\overline{\text{BLi}}$, which are to be accessed, are connected to the global data bus lines GDB1, $\overline{\text{GDB1}}$, GDB2, $\overline{\text{GDB2}}$, and the other pairs of bit lines BLi, $\overline{\text{BLi}}$, which are not to be accessed, are disconnected (isolated) from the global data bus lines GDB1, $\overline{\text{GDB1}}$, GDB2, $\overline{\text{GDB2}}$, by which a stray capacity in the global data bus line is reduced to increase a reading and writing speed.

I claim:

1. A semiconductor memory device comprising:

a memory cell array divided into a plurality of blocks, each block comprising:

a sense amplifier, a memory cell, a bit line connected to the sense amplifier and to the memory cell, a data bus line coupled to the bit line and being used commonly for a reading operation and a writing operation, a first column selection switch coupled between the data bus line and the bit line, and a second column selection switch coupled between the data bus line and the bit line;

a common column decoder outputting a first decoder output and a second decoder output;

a first column selection line, coupled to the common column decoder, receiving the first decoder output, and outputting a first selection output during the reading operation; and a second column selection line, coupled to the common column decoder, receiving the second decoder output, and outputting a second selection output during the writing operation, said first column selection switch in each block being turned ON through said first column selection line during the reading operation, and said second column selection switch in each block being turned ON through said second column selection line during the writing operation writing data.

2. A semiconductor memory device comprising:

a common column decoder outputting a first decoder output and a second decoder output;

a first column selection line coupled to the common column decoder and provided for a reading operation;

a second column selection line coupled to the common column decoder and provided for a writing operation;

a data bus line being used commonly for the reading operation and the writing operation; and a memory cell array comprising blocks, each block comprising:

a bit line, a first column selection switch coupled to the first column selection line and between the data bus line and the bit line, and receiving the first decoder output, a second column selection switch coupled to the second column selection line and between the data bus line and the bit line, and receiving the second decoder output, a sense amplifier, and a memory cell connected to the sense amplifier, to the first column selection switch, and to the second column selection switch.

3. A semiconductor memory device as claimed in claim 1, further comprising:

a plurality of bit lines, a plurality of first column selection switches, and a plurality of second column selection switches, said data bus line comprising a plurality of bus conductors, wherein each of the plurality of bus conductors is connected to a corresponding one of the plurality of first column selection switches and a corresponding one of the second column selection switches, said plurality of first column selection switches being simultaneously selected and said plurality of second column selection switches being simultaneously selected.

* * * * *

UNITED STATES PATENT AND TRADEMARK OFFICE
CERTIFICATE OF CORRECTION

PATENT NO. : 5,553,032
DATED : September 3, 1996
INVENTOR(S) : Masao TAGUCHI, et al.

It is certified that error appears in the above-indentified patent and that said Letters Patent is hereby corrected as shown below:

Col. 2, line 47, change "Vcc" (second occurrence) to --$V_{cc}$--.

Col. 3, line 8, change "to" (second occurrence) to --too--; and line 62, change "Vcc" to --$V_{cc}$--.

Col. 4, line 34, delete "O"; and line 35, before "V," insert --O--.

Col. 5, line 24, after "of" insert --the--.

Col. 8, line 43, change "An" to --A--; and line 50, change "When" to --when--.

Col. 9, line 15, change "CGS" to --CG5--; and line 18, change "Ai" to --Ai'--.

Col. 10, line 31, change "an" to --a--;

line 38, delete "O"; and line 53, change "an" to --a--.

UNITED STATES PATENT AND TRADEMARK OFFICE
CERTIFICATE OF CORRECTION

PATENT NO. : 5,553,032
DATED : September 3, 1996
INVENTOR(S) : Masao TAGUCHI, et al.

It is certified that error appears in the above-indentified patent and that said Letters Patent is hereby corrected as shown below:

Col. 11, line 3, change "BL1" to --BLi--; and line 26, change "$\overline{BL1}$" to --$\overline{BLi}$--.

Col. 12, line 24, delete "pair of bit lines".

Signed and Sealed this

Fourth Day of March, 1997

Attest:

BRUCE LEHMAN

*Attesting Officer*     Commissioner of Patents and Trademarks